United States Patent
Aminpur et al.

(10) Patent No.: US 6,902,870 B1
(45) Date of Patent: Jun. 7, 2005

(54) PATTERNING OF DIELECTRIC WITH ADDED LAYERS OF MATERIALS ASIDE FROM PHOTORESIST FOR ENHANCED PATTERN TRANSFER

(75) Inventors: Massud-A. Aminpur, Austin, TX (US); Kay Hellig, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 196 days.

(21) Appl. No.: 10/174,915

(22) Filed: Jun. 19, 2002

(51) Int. Cl.[7] .................... G03F 7/00; H01L 21/4763
(52) U.S. Cl. .................. 430/320; 430/322; 430/324; 438/622; 438/638
(58) Field of Search .................. 430/320, 322, 430/324; 438/622, 638

(56) References Cited

U.S. PATENT DOCUMENTS 6,399,512 B1 * 6/2002 Blosse et al. ............... 438/723
2002/0031906 A1 * 3/2002 Jiang et al. ................. 438/622
2002/0182894 A1 * 12/2002 Andideh .................... 438/796

* cited by examiner

*Primary Examiner*—Yvette C. Thornton
(74) *Attorney, Agent, or Firm*—Monica H. Choi (57) ABSTRACT

For patterning an opening through a patterned material, a coating material, a slow-etch material, and a photoresist material are deposited over the patterned material. The opening is patterned through the photoresist material, and the slow-etch material exposed through the opening is etched away. The photoresist material and the coating material exposed through the opening are then etched away. A remaining portion of the slow-etch hard-mask material and the patterned material exposed through the opening are then etched away such that the coating material outside of the opening is exposed. A remaining portion of the coating material is then etched away with an etch agent that does not etch the patterned material.

15 Claims, 7 Drawing Sheets

PATTERNING OF DIELECTRIC WITH ADDED LAYERS OF MATERIALS ASIDE FROM PHOTORESIST FOR ENHANCED PATTERN TRANSFER

TECHNICAL FIELD

The present invention relates generally to photolithography processes for fabrication of integrated circuits, and more particularly, to patterning a dielectric material using added layers of materials deposited along with the photoresist on top of the dielectric material, for enhanced pattern transfer to the dielectric material.

BACKGROUND OF THE INVENTION

Figure 1:
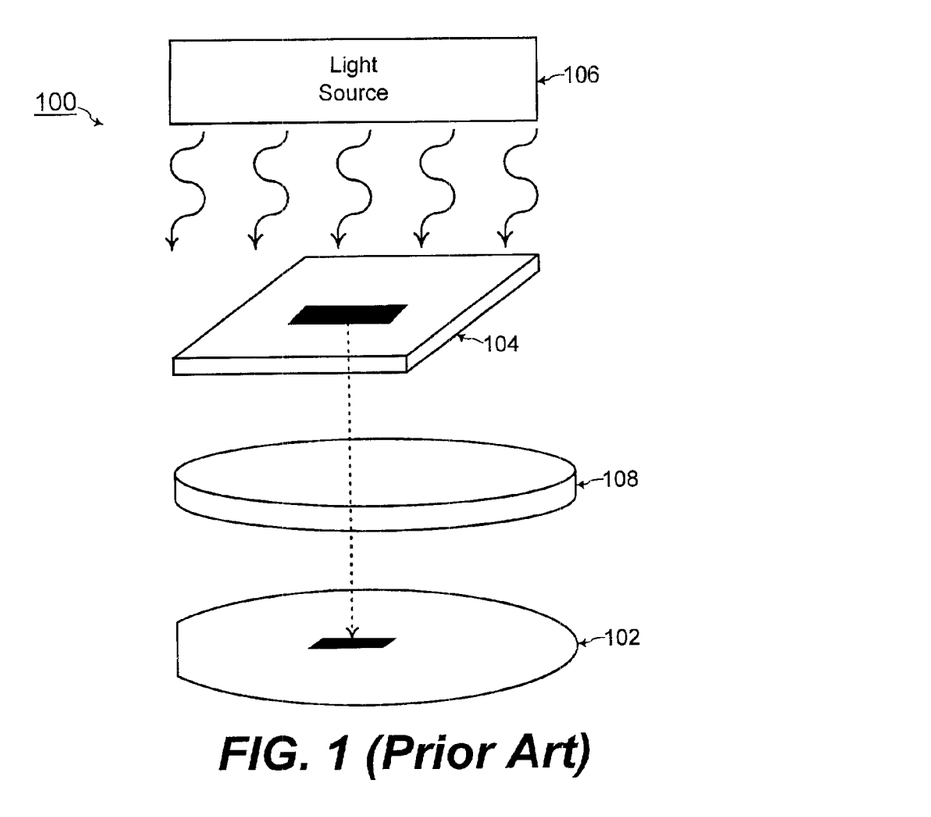
FIG. 1 shows components of a typical photolithography system, according to the prior art.

Referring to FIG. 1, a photolithography system 100 is used for patterning integrated circuit structures on a semiconductor wafer 102. In the photolithography system 100, a reticle 104 has a pattern of polygons thereon to be patterned onto the semiconductor wafer 102. Light from a light source 106 is illuminated through the pattern of polygons on the reticle 104 onto the semiconductor wafer 102. In addition, a lens system 108 is used within the photolithography system 100 to typically reduce the image of the pattern of polygons on the reticle 104 onto the semiconductor wafer 102. The pattern of polygons on the reticle 104 are typically opaque to the light from the light source 106.

A photoresist material on the semiconductor wafer 102 is cured when light from the light source 106 reaches the photoresist material and is not cured otherwise. When the photoresist material is then developed, cured photoresist material may be etched away while the uncured photoresist material remains, and the remaining uncured photoresist material may further act as a mask for etching away exposed material deposited below the photoresist material. Thus, when the light from the light source 106 does not reach the semiconductor wafer 102 for the pattern of opaque polygons on the reticle 104, the pattern of polygons on the reticle 104 is transferred to the photoresist material on the semiconductor wafer 102. Such a photolithography system 100 is known to one of ordinary skill in the art of integrated circuit fabrication.

A long-recognized important objective in the constant advancement of IC (Integrated Circuit) technology is the scaling-down of IC dimensions. Such scaling-down of IC dimensions is critical to obtaining higher speed performance of integrated circuits. Moreover, reducing the area of an IC die leads to higher yield in IC fabrication. Such advantages are a driving force to constantly scale down IC dimensions.

As the dimensions of integrated circuit structures are constantly scaled down such that a desired dimension of an integrated circuit structure is smaller than the wavelength of the light from the light source 106 within the photolithography system 100, the shape and dimensions of the structure formed on the semiconductor wafer 102 is distorted from non-linear light diffraction and optical proximity effects, as known to one of ordinary skill in the art of photolithography. Thus, the wavelength of light from the light source 106 is desired to be lowered to 193 nm (nanometer), 157 nm (nanometer), or EUV (extreme ultraviolet) light technology from 248 nm (nanometer) technology.

Figure 2:
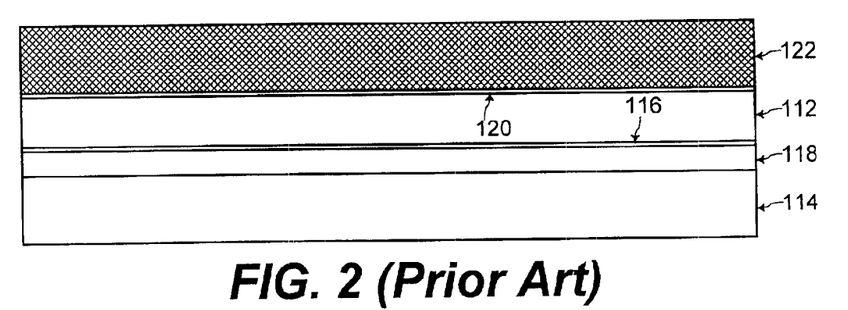
FIGS. 2–5 show cross-sectional views illustrating the etch of an opening through a layer of dielectric material using just a layer of photoresist material with profile degradation from corner rounding of the opening, according to the prior art.

Referring to FIG. 2, a layer of dielectric material 112 formed on a semiconductor substrate 114 is desired to be patterned with an opening formed through the layer of dielectric material 112. For example, the opening formed through the layer of dielectric material 112 may be a trench or a via hole to be subsequently filled with a conductive material such as copper for forming a metal line or a via structure for interconnect of an integrated circuit. In that case, the layer of dielectric material 112 is comprised of a low-K dielectric material having a dielectric constant that is lower than the dielectric constant of silicon dioxide ($SiO_2$). Such a low-K dielectric material surrounding interconnect structures is advantageous for lower capacitance between the interconnect structures. Such lower capacitance results in higher speed performance of the integrated circuit and also in lower power dissipation. In addition, such lower capacitance results in lower cross-talk between the interconnect structures. Lower cross-talk between interconnect structures is especially advantageous when the interconnect structures are disposed closer together as device density continually increases.

An example of the low-K dielectric material forming the layer of dielectric material 112 referred to by the name of "Black-Diamond"™ is commercially available from Applied Materials, Inc., headquartered in Sunnyvale, Calif. Such a low-K dielectric material is comprised of the elements silicon, carbon, oxygen, and hydrogen.

Referring back to FIG. 2, the layer of dielectric material 112 is deposited onto a layer of etch-stop material 116 which is in turn deposited on a layer of underlying material 118. For example, when the opening to be patterned through the layer of dielectric material 112 is a via hole, the underlying material 118 is comprised of metal of an underlying metal line structure. Alternatively, when the opening to be patterned through the layer of dielectric material 112 is a trench, the underlying material 118 is comprised of a dielectric material. The layer of etch-stop material 116 is comprised of silicon nitride ($Si_3N_4$) or silicon carbide (SiC).

In addition, a layer of capping material 120 is deposited on the layer of dielectric material 112. The layer of capping material 120 is comprised of silicon dioxide ($SiO_2$). Then, a layer of photoresist material 122 is deposited on the layer of capping material 120. For patterning integrated circuit structures with reduced dimensions, the photoresist material 122 is for a photolithography system using the lower wavelength of 193 nm (nanometer), 157 nm (nanometer), or EUV (extreme ultraviolet) rather than 248 nm (nanometer). Such photoresist material 122 for a photolithography system using the lower wavelength of 193 nm (nanometer), 157 nm (nanometer), or EUV (extreme ultraviolet) is known to one of ordinary skill in the art of integrated circuit photolithography.

Figure 3:
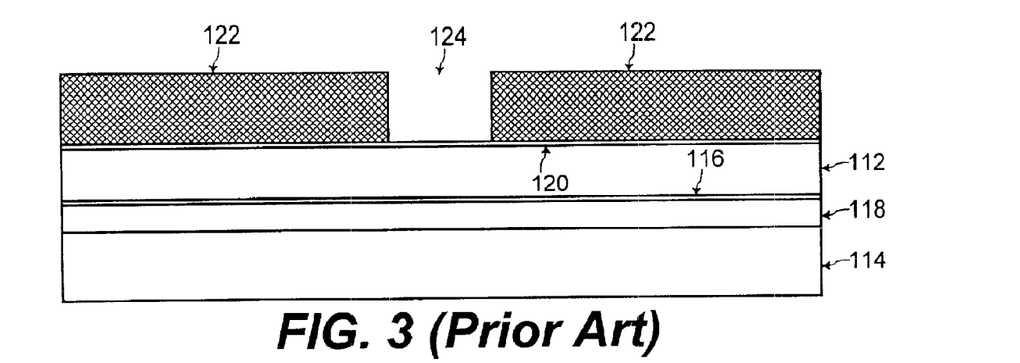
Figure 4:
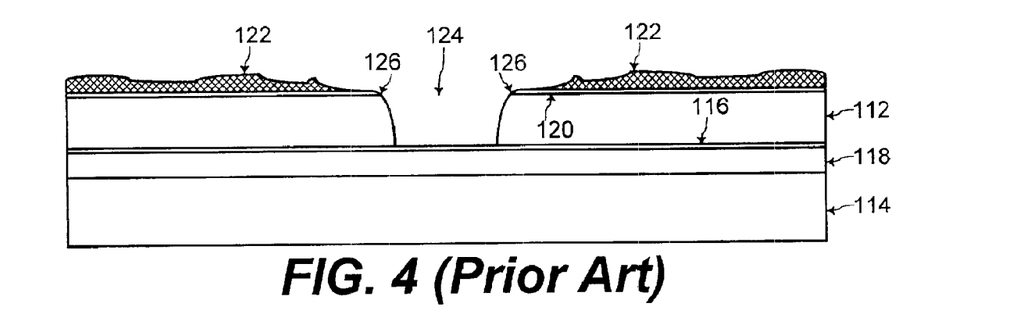
Figure 5:
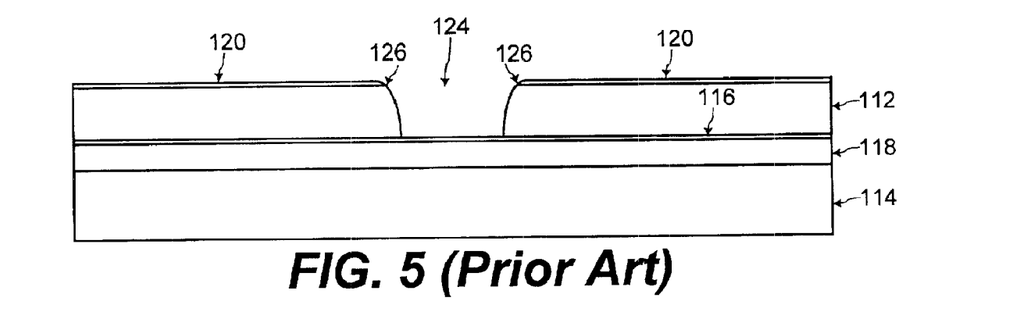

Referring to FIG. 3, for patterning an opening through the layer of dielectric material 112, an opening 124 is patterned through the layer of photoresist material 122 within a photolithography system, such as the photolithography system 100 of FIG. 1. Referring to FIG. 4, the region of the layer of capping material 120 and the layer of dielectric material 112 exposed through the opening 124 of the layer of photoresist material 122 is etched away until the etch-stop material 116 is exposed at the bottom wall of the opening 124. When the layer of dielectric material 112 is comprised of the low-K dielectric material comprised of the elements silicon, carbon, oxygen, and hydrogen, such as the "Black-Diamond"™ dielectric material, an aggressive etch process using fluorine plasma is used to etch the opening through the layer of dielectric material 112. Referring to FIGS. 4 and 5, after etching the opening 124 through the dielectric material 112, the remaining photoresist 122 is removed in a subsequent etch process using oxygen plasma.

Further referring to FIG. 4, however, the photoresist material 122 is also etched away during the etching of the opening 124 through the low-K dielectric material 112 because the etch selectivity (i.e., the ratio of the etch rate of the low-K dielectric material 112 to the etch rate of the photoresist material 122) is not high. In addition, such etch selectivity decreases even further when the photoresist material 122 is for a photolithography system using the lower wavelength of 193 mn (nanometer), 157 nm (nanometer), or EUV (extreme ultraviolet) rather than 248 nm (nanometer). For example, when the photoresist material 122 is for a photolithography system using the lower wavelength of 193 nm (nanometer), 157 nm (nanometer), or EUV (extreme ultraviolet) and when the low-K dielectric material 112 is comprised of the "Black-Diamond"™ dielectric material, the selectivity of the photoresist material 122 to the low-K dielectric material 112 in an etch process using fluorine plasma is 2:1 (i.e., in that case, the low-K dielectric material 112 etches two-times faster than the photoresist material 122).

Further referring to FIG. 4, because of such low etch selectivity between the photoresist material 122 and the low-K dielectric material 112, the photoresist material 122 is also etched away by the fluorine plasma during the etch process for etching the low-K dielectric material 112. When the photoresist material 122 is etched away near the top corners 126 of the opening 124 formed by the low-K dielectric material 112, such top corners 126 are etched away to result in rounding at such corners 126 of the opening 124. Such rounding of the top corners 126 results in profile degradation of the structures to be patterned within the low-K dielectric material 112.

A thicker layer of photoresist material 122 may be used to ensure that the photoresist material 122 is not etched away from the top corners 126 of the opening 124 during the etch process for etching the opening 124 through the dielectric material 112 to prevent such profile degradation. However, the thicker layer of photoresist material 122 may not be developed properly with the light source of the photolithography system through-out the greater depth of the thicker photoresist material 122. The depth of focus for developing the photoresist material 122 by the light source of the photolithography system is limited. Furthermore, the depth of focus for developing the photoresist material 122 decreases when the wavelength of light from the light source of the photolithography system decreases. Thus, when the wavelength of light from the light source of the photolithography system is desired to be lowered to 193 nm (nanometer), 157 nm (nanometer), or EUV (extreme ultraviolet) technology from 248 nm (nanometer) technology, the thickness of the photoresist material 122 should be minimized rather than increased.

Furthermore, increasing the thickness of the photoresist material 122 is further disadvantageous because such thicker photoresist material 122 increases the aspect ratio of the opening formed through such photoresist material 122 and the dielectric material 112. Etching an opening with higher aspect ratio is more difficult as known to one of ordinary skill in the art of integrated circuit fabrication.

Thus, a mechanism is desired for preventing profile degradation during etch of an opening through a dielectric material with a photoresist material having low etch selectivity from the dielectric material without increasing the thickness of the photoresist material.

SUMMARY OF THE INVENTION

Accordingly, in a general aspect of the present invention, for patterning a dielectric material, added layers of materials are deposited along with the photoresist on top of the dielectric material with added etch process steps, for enhanced pattern transfer to the dielectric material.

In one embodiment of the present invention, for patterning an opening through a dielectric material, a layer of coating material is deposited on top of the dielectric material, a layer of slow-etch hard-mask material is deposited on top of the layer of coating material, and a layer of photoresist material is deposited on top of the layer of slow-etch hard-mask material. The opening is patterned through the photoresist material in a photolithography process. The slow-etch hard-mask material exposed through the opening is etched away in a first etch process with a first etch agent. The coating material exposed through the opening is etched away in a second etch process with a second etch agent that also etches away the photoresist material during the second etch process.

In addition, a portion of the dielectric material is exposed through the opening after the second etch process, and the slow-etch hard-mask material and the coating material outside of the opening remain on the dielectric material after the second etch process. The dielectric material exposed through the opening is etched away in a third etch process with a third etch agent, and any remaining portion of the slow-etch hard-mask material outside of the opening is etched away to expose the coating material outside of the opening during the third etch process. An etch rate of the slow-etch hard-mask material in the third etch agent is slower than an etch rate of the dielectric material in the third etch agent and of the coating material in the third etch agent. The dielectric material exposed through the opening is substantially etched away during the third etch process. A thickness of the layer of slow-etch hard-mask material is adjusted such that the slow-etch hard-mask material outside of the opening is substantially etched away while a substantial portion of the coating material outside of the opening remains after the third etch process. Any remaining portion of the coating material is etched away in a fourth etch process using a fourth etch agent that does not etch the dielectric material.

The present invention may be used to particular advantage when the photoresist material is for the photolithography process using light with a wavelength of about 193 nm, 157 nm (nanometer), or EUV (extreme ultraviolet) when the layer of coating material is comprised of an organic ARC (anti-reflective coating) material, when the layer of slow-etch hard-mask material is comprised of one of silicon carbide (SiC) or nitrogen-doped silicon carbide (SiC—N), and when the dielectric material is a low-K dielectric material comprised of silicon, carbon, oxygen, and hydrogen. In that case, the third etch agent for etching away the low-K dielectric material during the third etch process is comprised of fluorine plasma, and the fourth etch agent for etching away the coating material during the fourth etch process is comprised of oxygen plasma.

Such a slow-etch hard-mask material has a high etch selectivity from such a dielectric material. For example, the etch selectivity between such a slow-etch hard-mask material from such a dielectric material may be as high as 6:1 in the etch process using fluorine plasma for etching the opening through the dielectric material (i.e., the etch rate of such a dielectric material is six-times faster than the etch rate of such a slow-etch hard-mask material). Thus, the thicknesses of the layer of slow-etch hard-mask material and the layer of coating material may be maintained relatively low. Such thinner layers of the slow-etch hard-mask material and the coating material for patterning the opening through the dielectric material is advantageous for lower aspect ratio of the opening formed through such layers and the dielectric material such that openings with lower dimensions may be patterned. In addition, the thickness of the layer of slow-etch hard-mask material is adjusted such that the layer of coating material remains after the etch process for etching the opening through the dielectric material to prevent profile degradation from corner rounding of the opening through the dielectric material.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–17 refer to elements having similar structure and function.

DETAILED DESCRIPTION

Figure 6:
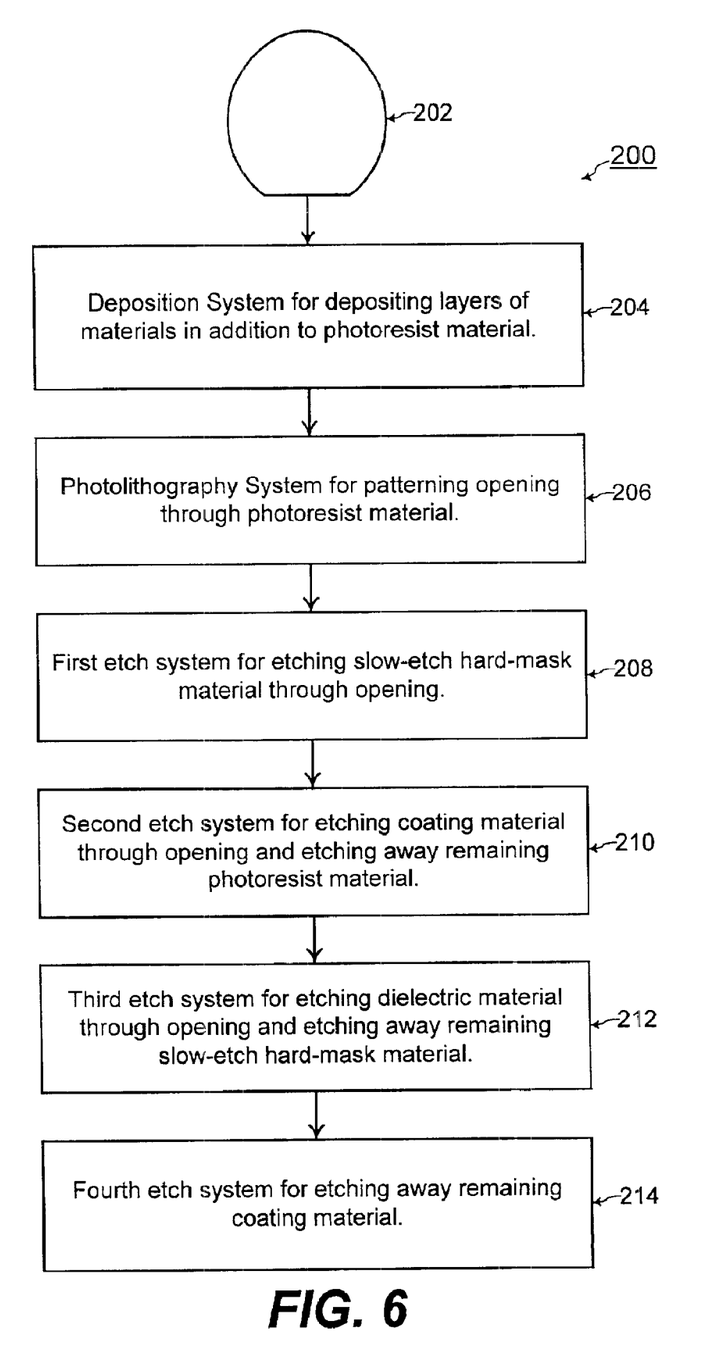
FIG. 6 shows a system for etching an opening through a layer of dielectric material using added layers of materials deposited along with the photoresist on top of the dielectric material with added etch process steps, for enhanced pattern transfer to the dielectric material, according to one embodiment of the present invention.
Figure 7:
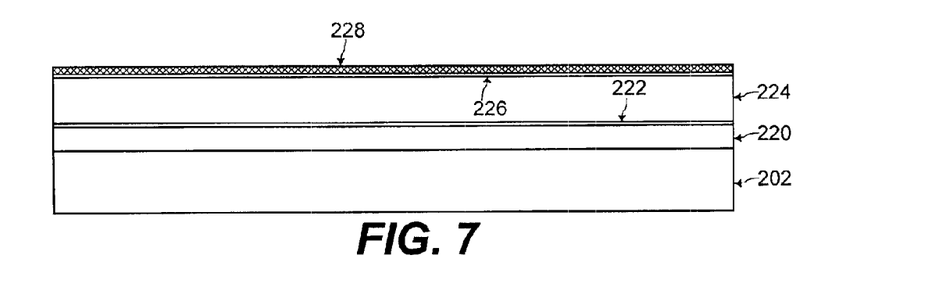
FIGS. 7–14 show cross-sectional views illustrating the etch of the opening through the layer of dielectric material by the system of FIG. 6, according to one embodiment of the present invention.

Referring to FIG. 6, a semiconductor substrate 202 is processed through a system 200 for forming an opening through a dielectric material deposited on the semiconductor substrate 202. The semiconductor substrate 202 is a silicon wafer according to one embodiment of the present invention. Referring to FIGS. 6 and 7, the system 200 includes a deposition system 204 for depositing layers of materials on the semiconductor substrate 202.

Referring to FIG. 7, the semiconductor substrate 202 may initially have a layer of underlying material 220 already deposited thereon. For example, when the opening to be patterned through the dielectric material is a via hole, the underlying material 220 is comprised of metal of an underlying metal line structure. Alternatively, when the opening to be patterned through the dielectric material is a trench, the underlying material 220 is comprised of a dielectric material.

Further referring to FIGS. 6 and 7, the deposition system 204 is used for depositing a layer of etch stop material 222 on the layer of underlying material 220. The layer of etch-stop material 222 is comprised of silicon nitride ($Si_3N_4$) or silicon carbide (SiC) having a thickness of from about 300 to about 700 Å (angstroms), according to one embodiment of the present invention. Processes within the deposition system 204 for depositing such a layer of etch-stop material 222 are known to one of ordinary skill in the art of integrated circuit fabrication.

Further referring to FIGS. 6 and 7, the deposition system 204 is used for depositing a layer of dielectric material 224 on the layer of etch stop material 222. The layer of dielectric material 224 is comprised of a low-K dielectric material including the elements silicon, carbon, oxygen, and hydrogen, such as the "Black-Diamond"™ dielectric material, and has a thickness of from about 2000 to about 12000 Å (angstroms), according to one embodiment of the present invention. Processes within the deposition system 204 for depositing such a layer of dielectric material 224 are known to one of ordinary skill in the art of integrated circuit fabrication.

In addition, the deposition system 204 is used for depositing a layer of capping material 226 on the layer of dielectric material 224. The layer of capping material 226 is comprised of silicon dioxide ($SiO_2$) having a thickness of from about 300 to about 1100 Å (angstroms), according to one embodiment of the present invention. Processes within the deposition system 204 for depositing such a layer of capping material 226 are known to one of ordinary skill in the art of integrated circuit fabrication.

Furthermore, the deposition system 204 is used for depositing a layer of coating material 228 on the layer of capping material 226. The layer of coating material 228 is comprised of an organic ARC (anti-reflective coating) material having a thickness of from about 1000 to about 7000 Å (angstroms), according to one embodiment of the present invention. Processes within the deposition system 204 for depositing such a layer of coating material 228 are known to one of ordinary skill in the art of integrated circuit fabrication.

Figure 8:
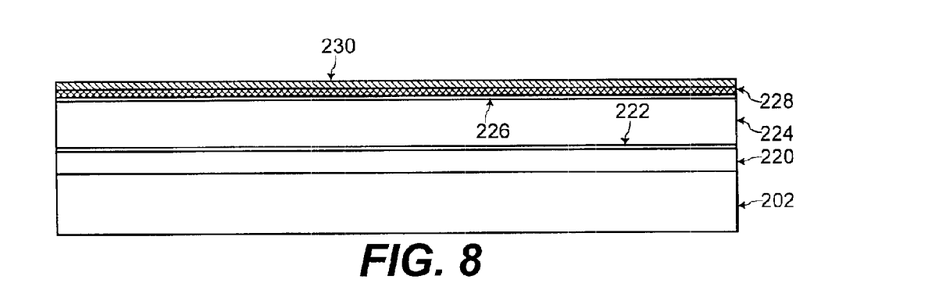

Referring to FIGS. 6 and 8, the deposition system 204 is then used for depositing a layer of slow-etch hard-mask material 230 on the layer of coating material 228. The layer of slow-etch hard-mask material 230 is comprised of one of silicon carbide (SiC) or nitrogen-doped silicon carbide (SiC—N) having a thickness of from about 100 to about 1000 Å (angstroms), according to one embodiment of the present invention. Processes within the deposition system 204 for depositing such a layer of slow-etch hard-mask material 230 are known to one of ordinary skill in the art of integrated circuit fabrication.

Figure 9:
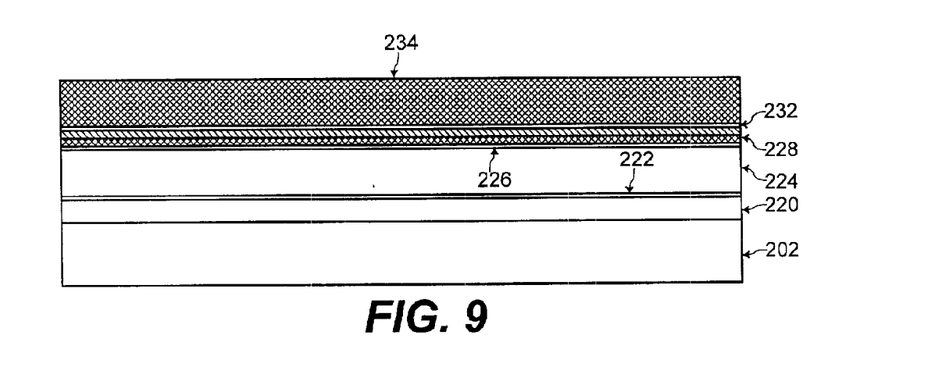

Referring to FIGS. 6 and 9, the deposition system 204 is then used for depositing a layer of reaction preventing material 232 on the layer of slow-etch hard-mask material 230. The layer of reaction preventing material 232 is comprised of silicon dioxide ($SiO_2$) having a thickness of from about 100 to about 500 Å (angstroms), according to one embodiment of the present invention. Processes within the deposition system 204 for depositing such a layer of reaction preventing material 232 are known to one of ordinary skill in the art of integrated circuit fabrication.

In addition, the deposition system 204 is then used for depositing a layer of photoresist material 234 on the layer of reaction preventing material 232. The layer of photoresist material 234 is for a photolithography system using light with the lower wavelength of 193 nm (nanometer), 157 nm (nanometer), or EUV (extreme ultraviolet) rather than 248 nm (nanometer) and has a thickness of from about 1000 to about 3500 Å (angstroms), according to one embodiment of the present invention. Such a photoresist material 234 and processes within the deposition system 204 for depositing such a layer of photoresist material 234 are known to one of ordinary skill in the art of integrated circuit fabrication.

The layer of reaction preventing material 232 prevents reaction between such slowetch hard-mask material 230 and such photoresist material 234 to prevent degradation of the photoresist material 234. However, the present invention may be practiced with or without the layer of reaction preventing material 232 depending on the reactivity between the slow-etch hard-mask material 230 and the photoresist material 234.

The deposition system 204 for depositing the layers of materials 222, 224, 226, 228, 230, 232, and 234 may be comprised of different deposition chambers for depositing each of the layers of materials 222, 224, 226, 228, 230, 232, and 234. Alternatively, the same deposition chamber of the deposition system 204 may be used for depositing at least two of the layers of materials 222, 224,226, 228, 230, 232, and 234.

Figure 10:
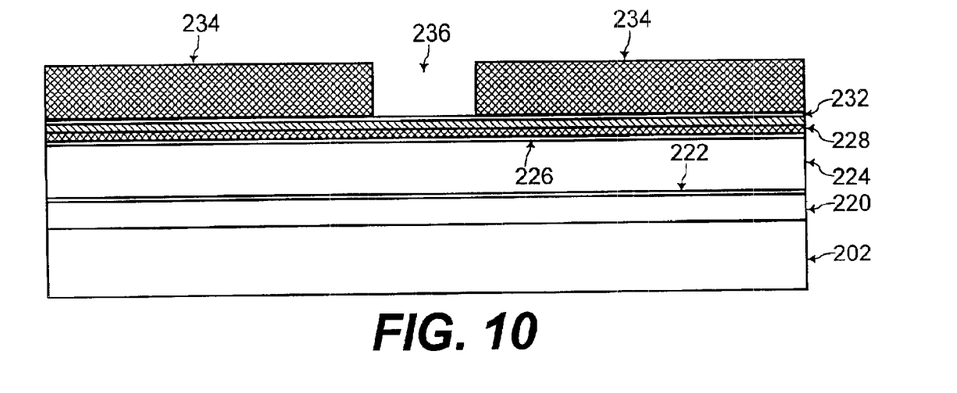

Referring to FIGS. 6 and 10, the system 200 includes a photolithography system 206 for patterning an opening 236 through the layer of photoresist material 234. The photolithography system 206 is similar to the photolithography system 100 of FIG. 1. In one embodiment of the present invention, the photolithography system 206 uses light with a wavelength of 193 nm (namometers), 157 nm (nanometer), or EUV (extreme ultraviolet) when the layer of photoresist material 234 is correspondingly for a photolithography system using light with a wavelength of 193 nm (namometers), 157 nm (nanometer), or EUV (extreme ultraviolet). Processes and the photolithography system 206 for patterning the opening 236 through the layer of photoresist material 234 are known to one of ordinary skill in the art of integrated circuit fabrication.

Figure 11:
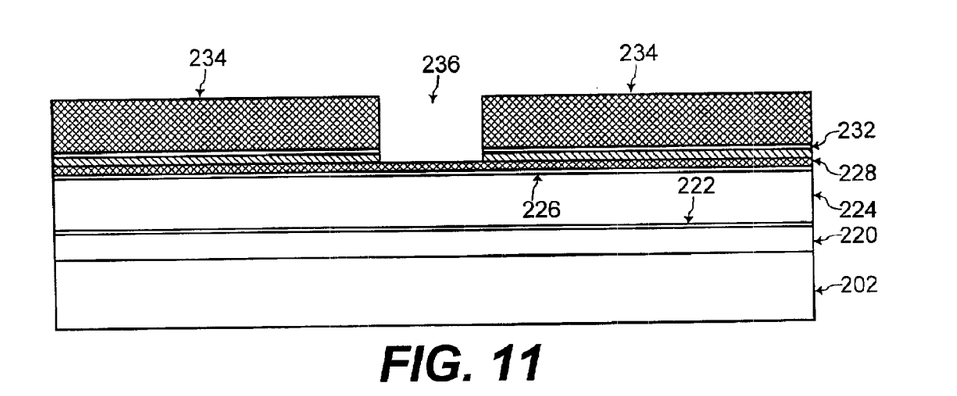

Referring to FIGS. 6 and 11, the system 200 includes a first etch system 208 for etching a portion of the layer of reaction preventing material 232 and a portion of the layer of slow-etch hard-mask material 230 exposed through the opening 236 in a first etch process using a first etch agent. In one embodiment of the present invention, the first etch agent is comprised of fluorine plasma for etching the layer of reaction preventing material 232 and the layer of slow-etch hard-mask material 230 exposed through the opening 236. After the first etch process, the coating material 228 is exposed at the bottom wall of the opening 236. Such etch processes within the first etch system 208 are known to one of ordinary skill in the art of integrated circuit fabrication.

When the layer of reaction preventing material 232 is comprised of silicon dioxide ($SiO_2$) having a thickness of from about 100 to about 500 Å (angstroms) and the layer of slow-etch hard-mask material 230 is comprised of one of silicon carbide (SiC) or nitrogen-doped silicon carbide (SiC—N) having a thickness of from about 100 to about 1000 Å (angstroms), the thickness of the photoresist material 234 may also be relatively thin for etching away such relatively thin layers of materials 232 and 230. With such thin layers of materials 234, 232, and 230, the aspect ratio of the opening 236 formed through such layers 234, 232, and 230 in FIG. 11 is advantageously minimized such that the opening 236 having reduced dimensions may be formed.

Figure 12:
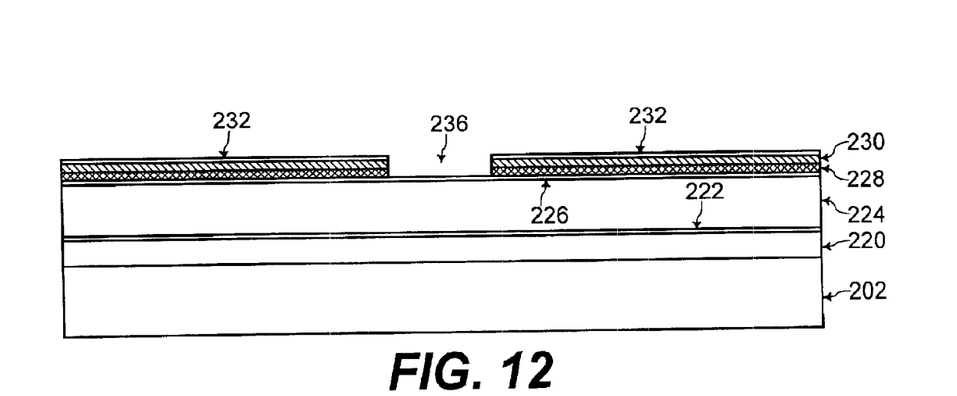

Referring to FIGS. 6 and 12, the system 200 includes a second etch system 210 for etching a portion of the layer of coating material 228 exposed through the opening 236 in a second etch process using a second etch agent. In one embodiment of the present invention, the second etch agent is comprised of oxygen plasma for etching the layer of coating material 228 exposed through the opening 236. After the second etch process, the capping material 226 is exposed at the bottom wall of the opening 236. In addition, during the second etch process using oxygen plasma, the photoresist material 234 is etched away such that the layer of reaction preventing material 232 outside the opening 236 is exposed. Additionally, after the second etch process, the layer of reaction preventing material 232 and the layer of slow-etch hard-mask material 230 remain outside the opening 236. Such etch processes within the second etch system 210 are known to one of ordinary skill in the art of integrated circuit fabrication.

Figure 13:
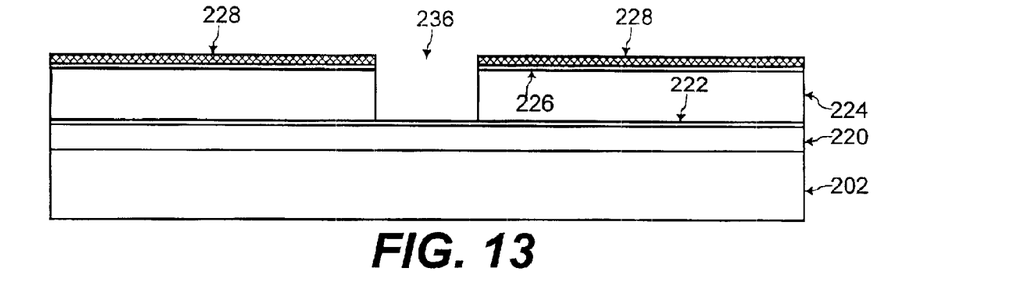

Referring to FIGS. 6 and 13, the system 200 includes a third etch system 212 for etching a portion of the layer of capping material 226 and the layer of dielectric material 224 exposed through the opening 236 in a third etch process using a third etch agent. In one embodiment of the present invention, the third etch agent is comprised of fluorine plasma for etching the layer of capping material 226 and the layer of dielectric material 224 exposed through the opening 236. When the capping material 226 is comprised of silicon dioxide ($SiO_2$) and the dielectric material 224 is comprised of the low-K dielectric material including the elements silicon, carbon, oxygen, and hydrogen, such as the "Black-Diamond"™ dielectric material, the etch selectivity between such a capping material 226 and such a dielectric material 224 is 1:1 such that the capping material 226 is readily etched away during the third etching step for etching away the dielectric material 224 to form the opening 236 through the dielectric material 224.

In addition, referring to FIGS. 12 and 13, during the third etch process, the remaining portion of the layer of reaction preventing material 232 and of the layer of slow-etch hard-mask material 230 outside the opening 236 is etched away by the fluorine plasma such that the layer of coating material 228 outside the opening 236 is exposed. Furthermore, after the third etch process, the etch-stop material 222 is exposed at the bottom wall of the opening 236. Such etch processes within the third etch system 212 are known to one of ordinary skill in the art of integrated circuit fabrication.

Figure 14:
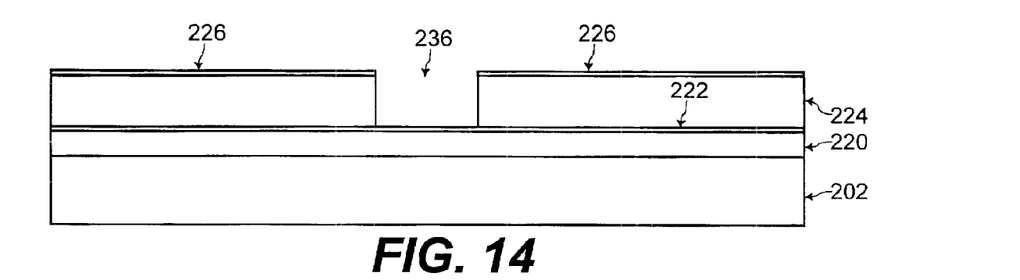

Referring to FIGS. 6 and 14, the system 200 includes a fourth etch system 214 for etching away the remaining portion of the layer of coating material 228 outside the opening 236 in a fourth etch process using a fourth etch agent. In one embodiment of the present invention, when the coating material 228 is comprised of an organic ARC (anti-reflective coating) material, the fourth etch agent is comprised of oxygen plasma for etching away the remaining portion of the layer of coating material 228 outside the opening 236. Such etch processes within the fourth etch system 214 are known to one of ordinary skill in the art of integrated circuit fabrication.

Such a fourth etch agent comprising oxygen plasma during the fourth etch process does not etch the capping material 226 and the dielectric material 224 such that profile degradation from corner rounding of the opening 236 is minimized with the present invention. Thus, the opening 236 patterned through the capping material 226 and the dielectric material 224 in FIG. 14 advantageously has minimized corner rounding.

In this manner, referring to FIGS. 12, 13, and 14, the opening 236 is initially formed through the layer of slow-etch hard-mask material 230 and the layer of coating material 228 before the photoresist material 234 is etched away. Thus, the relatively thick photoresist material 234 is etched away before the opening 236 is etched through the dielectric material 224 using the layer of slow-etch hard-mask material 230 and the layer of coating material 228 as the mask during etching of the dielectric material 224. The layer of slow-etch hard-mask material 230 is relatively thin because of the high etch selectivity between the slow-etch hard-mask material 230 and the dielectric material 224 during etching of the dielectric material 224. Because the layer of slow-etch hard-mask material 230 and the layer of coating material 228 are much thinner than the layer of photoresist material 234, the aspect ratio of the opening formed through the layer of slow-etch hard-mask material 230, the layer of coating material 228, and the layer of dielectric material 224 is minimized such that openings with reduced dimensions may be etched through the layer of dielectric material 224.

Furthermore, by etching the coating material 228 using oxygen plasma as the etch agent during the fourth etch process that does not etch the capping material 226 and the dielectric material 224, profile degradation from corner rounding of the opening 236 is minimized with the present invention. Thus, referring to FIGS. 6, 12, and 13, the coating material 228 is desired to remain and to be exposed after the third etch process for etching the opening through the dielectric material 224 and for etching away the remaining slow-etch hard-mask material 230. Thus, the thickness of the layer of slow-etch hard-mask material 230 deposited in FIG. 8 is adjusted such that the coating material 228 remains and is exposed after the third etch process for etching the opening 236 through the dielectric material 224 and for etching away the remaining slow-etch hard-mask material 230.

Figure 15:
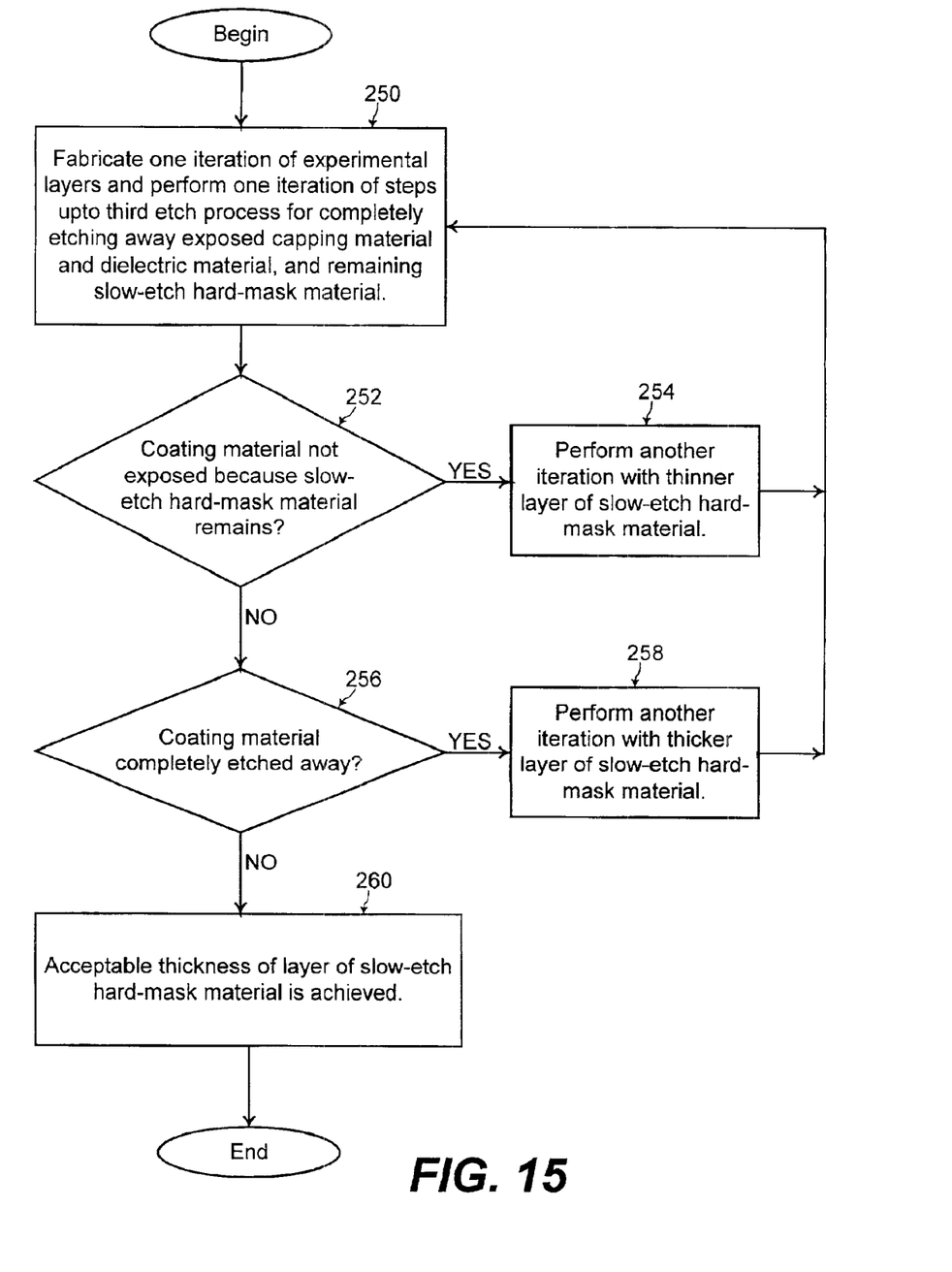
FIG. 15 shows a flow-chart of steps for adjusting the thickness of a layer of slow-etch hard-mask material for ensuring prevention of profile degradation from corner rounding of the opening through the dielectric material, according to one embodiment of the present invention.
Figure 16:
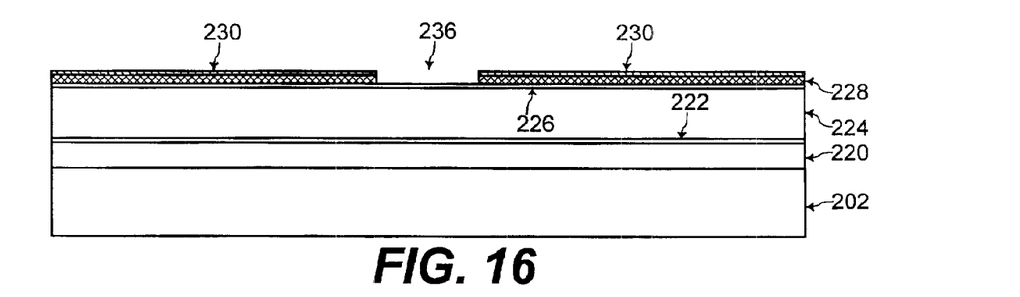
FIG. 16 shows a cross-sectional view illustrating an undesired portion of the layer of slow-etch hard-mask material remaining after the etch process for etching the opening through the dielectric material when the layer of slow-etch hard-mask material is too thick.

FIG. 15 shows a flow-chart of steps for adjusting such a thickness of the layer of slow-etch hard-mask material 230. An experiment is performed with one iteration of forming the layers of materials 222, 224, 226, 228, 230, 232, and 234 and performing the first, second, and third etch processes within the first, second, and third etch systems 208, 210, and 212 of FIG. 6, as already described herein (step 250 of FIG. 15). Referring to FIG. 16, if the layer of slow-etch hard-mask material 230 deposited in FIG. 8 is too thick, then after the third etch process for etching the opening through the dielectric material 224 and for etching away the remaining slow-etch hard-mask material 230, a portion of the slow-etch hard-mask material 230 still remains to cover the layer of coating material 228 such that the coating material is not exposed (step 252 of FIG. 15). In that case, another iteration is performed with forming the layers of materials 222, 224, 226, 228, 230, 232, and 234 and performing the first, second, and third etch processes within the first, second, and third etch systems 208, 210, and 212 of FIG. 6 but with the thickness of the layer of slow-etch hard-mask material 230 reduced during deposition of that layer in FIG. 8 (step 254 of FIG. 15).

Figure 17:
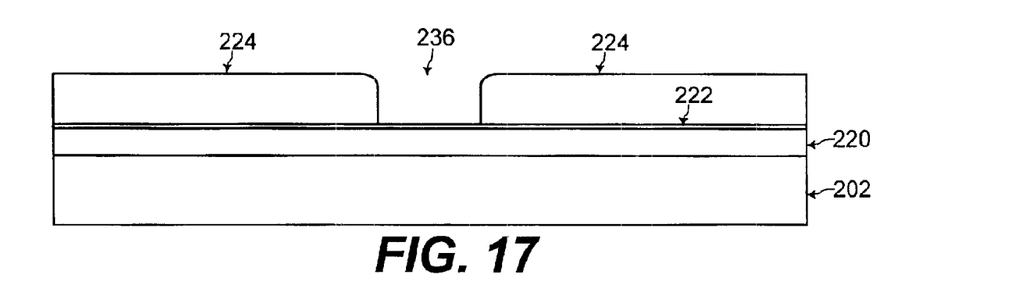
FIG. 17 shows a cross-sectional view illustrating undesired etch of a layer of coating material below the layer of slow-etch hard-mask material after the etch process for etching the opening through the dielectric material when the layer of slow-etch hard-mask material is too thin.

On the other hand, referring to FIG. 17, if the layer of slow-etch hard-mask material 230 deposited in FIG. 8 is too thin, then after the third etch process for etching the opening through the dielectric material 224 and for etching away the remaining slow-etch hard-mask material 230, all of the slow-etch hard-mask material 230 and the coating material 228 are etched away by the fluorine plasma of the third processing step (step 256 of FIG. 15). Additionally in that case, the fluorine plasma likely begins to etch the portion of the dielectric material 224 outside the opening 236 for undesired profile degradation of the opening 236. In that case, another iteration is performed with forming the layers of materials 222, 224, 226, 228, 230, 232, and 234 and performing the first, second, and third etch processes within the first, second, and third etch systems 208, 210, and 212 of FIG. 6 but with the thickness of the layer of slow-etch hard-mask material 230 increased during deposition of that layer in FIG. 8 (step 258 of FIG. 15).

Such iterative steps of FIG. 15 are repeated until the thickness of the layer of slow-etch hard-mask material 230 deposited in FIG. 8 is within an acceptable range such that the coating material 228 remains and is exposed after the third etch process for etching the opening 236 through the dielectric material 224 and for etching away the remaining slow-etch hard-mask material 230 (step 260 of FIG. 15). Such an acceptable range of the thickness of the layer of slow-etch hard-mask material 230 is likely to vary depending on the etch selectivity between the slow-etch hard-mask material 230 and the layer of dielectric material 224 during the third etch process and depending on the particular parameters of the third etch process of the third etch system 212.

The foregoing is by way of example only and is not intended to be limiting. For example, the present invention may be used for etching any type of opening through any type of dielectric material. Any materials and dimensions specified herein are by way of example only. Additionally, as will be understood by those skilled in the art, the structures described herein may be made or used in the same way regardless of their position and orientation. Accordingly, it is to be understood that terms and phrases such as "on" and "bottom" as used herein refer to relative location and orientation of various portions of the structures with respect to one another, and are not intended to suggest that any particular absolute orientation with respect to external objects is necessary or required. Furthermore, when one layer of material is stated to be deposited "on" another layer of material, the present invention may be practiced when an intervening layer of material is also present between such layers of materials.

The present invention is limited only as defined in the following claims and equivalents thereof.

We claim:

1. A method of patterning an opening through a dielectric material, including the steps of:
    depositing a coating material, a slow-etch material, and a photoresist material over the dielectric material;
    patterning the opening through the photoresist material;
    etching away the slow-etch material exposed through the opening in a first etch process;
    etching away the photoresist material and the coating material exposed through the opening, in a second etch process after the first etch process; and
    etching away a remaining portion of the slow-etch hard-mask material and the dielectric material exposed through the opening such that the coating material outside of the opening is exposed, in a third etch process after the second etch process.

2. The method of claim 1, further including the step of:
    etching away a remaining portion of the coating material with an etch agent that does not etch the dielectric material, in a fourth etch process after the third etch process.

3. The method of claim 2, wherein the coating material is comprised of an organic ARC (anti-reflective coating) material, having a thickness in a range of from about 1000 to about 7000 Å (angstroms), and wherein the etch agent for etching away the coating material is comprised of oxygen plasma.

4. The method of claim 2, further including the step of:
    depositing a capping material between the dielectric material and the coating material, wherein the capping material remains on the dielectric material outside the opening after the coating material is etched away.

5. The method of claim 4, wherein the capping material is comprised of silicon dioxide ($SiO_2$) having a thickness in a range of from about 300 to about 1100 Å (angstroms).

6. The method of claim 1, further including the step of:
forming an etch stop material below the dielectric material, wherein the etch stop material is exposed at the bottom of the opening through the dielectric material.

7. The method of claim 6, wherein the etch stop material is comprised of one of silicon nitride ($Si_3N_4$) or silicon carbide (SiC) having a thickness in a range of from about 300 to about 700 Å (angstroms).

8. The method of claim 1, wherein the photoresist material is for a photolithography process using light with a wavelength of about 193 nm (nanometers), 157 nm (nanometer), or EUV (extreme ultraviolet) and has a thickness in a range of from about 1000 to about 3500 Å (angstroms).

9. The method of claim 1, wherein the dielectric material is a low-K dielectric material comprised of silicon, carbon, oxygen, and hydrogen, and having a thickness in a range of from about 2000 to about 12000 Å (angstroms), and wherein an etch agent for etching away the low-K dielectric material is comprised of fluorine plasma.

10. The method of claim 1, wherein the coating material is comprised of an organic ARC (anti-reflective coating) material having a thickness in a range of from about 1000 to about 7000 Å (angstroms).

11. The method of claim 1, wherein the slow-etch material is comprised of one of silicon carbide (SiC) or nitrogen-doped silicon carbide (SiC—N) having a thickness in a range of from about 100 to about 1000 Å (angstroms).

12. The method of claim 11, wherein an etch agent for etching away the slow-etch material is comprised of fluorine plasma.

13. The method of claim 1, further including the step of:
depositing a reaction preventing material between the slow-etch material and the photoresist material;
and wherein the reaction preventing material exposed through the opening is etched away during etching of the slow-etch material, and wherein a remaining portion of the reaction preventing material is etched away during etching of the dielectric material.

14. The method of claim 1, wherein the slow-etch material is comprised of one of silicon carbide (SiC) or nitrogen-doped silicon carbide (SiC—N), and wherein the photoresist material is for the photolithography process using light with a wavelength of about 193 nm (nanometers), 157 nm (nanometer), or EUV (extreme ultraviolet), and wherein the reaction preventing material is comprised of silicon dioxide ($SiO_2$) having a thickness in a range of from about 100 to about 500 Å (angstroms).

15. A method for patterning an opening through a dielectric material that is a low-K dielectric material comprised of silicon, carbon, oxygen, and hydrogen, and having a thickness in a range of from about 2000 to about 12000 Å (angstroms), the method including the steps of:

A. forming a layer of etch stop material below the dielectric material;
wherein the etch stop material is comprised of one of silicon nitride ($Si_3N_4$) or silicon carbide (SiC) having a thickness in a range of from about 300 to about 700 Å (angstroms);

B. depositing a layer of capping material on the dielectric material;
wherein the layer of capping material is comprised of silicon dioxide ($SiO_2$) having a thickness in a range of from about 300 to about 1100 Å (angstroms);

C. depositing a layer of coating material on top of the layer of capping material;
wherein the layer of coating material is comprised of an organic ARC (anti-reflective coating) material having a thickness in a range of from about 1000 to about 7000 Å (angstroms)

D. depositing a layer of slow-etch hard-mask material on top of the layer of coating material;
wherein the layer of slow-etch hard-mask material is comprised of one of silicon carbide (SiC) or nitrogen-doped silicon carbide (SiC—N) having a thickness in a range of from about 100 to about 1000 Å (angstroms);

E. depositing a layer of reaction preventing material on the layer of slow-etch hard-mask material;
wherein the layer of reaction preventing material is comprised of silicon dioxide ($SiO_2$) having a thickness in a range of from about 100 to about 500 Å (angstroms);

F. depositing a layer of photoresist material on top of the layer of reaction preventing material that prevents reaction between the slow-etch hard-mask material and the photoresist material that is for the photolithography process using light with a wavelength of about 193 nm (nanometers), 157 nm (nanometer), or EUV (extreme ultraviolet) and having a thickness in a range of from about 1000 to about 3500 Å (angstroms);

G. patterning the opening through the photoresist material in a photolithography process;

H. etching away the slow-etch hard-mask material and the reaction preventing material exposed through the opening in a first etch process with a first etch agent comprised of fluorine plasma;

I. etching away the coating material exposed through the opening, after the first etch process, in a second etch process with a second etch agent comprised of oxygen plasma that also etches away the photoresist material during the second etch process,
wherein a portion of the dielectric material is exposed through the opening after the second etch process, and wherein the slow-etch hard-mask material and the coating material outside of the opening remain on the dielectric material after the second etch process;

J. etching the capping material and the dielectric material exposed through the opening, and etching away any remaining portion of the slow-etch hard-mask material and the reaction preventing material outside of the opening to expose the coating material outside of the opening, after the second etch process, in a third etch process with a third etch agent comprised of fluorine plasma;
wherein an etch rate of the slow-etch hard-mask material in the third etch agent is slower than an etch rate of the dielectric material in the third etch agent and of the coating material in the third etch agent;
and wherein the dielectric material exposed through the opening is substantially etched away during the third etch process such that the etch stop material is exposed at the bottom of the opening after the step J;
and wherein a substantial portion of the coating material outside of the opening remains after the third etch process; and K. etching away any remaining portion of the coating material, after the third etch process, in a fourth etch process using a fourth etch agent comprised of oxygen plasma that does not etch the dielectric material and the capping material.

* * * * *